(12) United States Patent
Taniyama et al.

(10) Patent No.: US 6,357,457 B1
(45) Date of Patent: Mar. 19, 2002

(54) SUBSTRATE CLEANING APPARATUS AND METHOD

(75) Inventors: Hiroki Taniyama, Tosu; Youichi Tanaka, Kitakyushu; Toshihiko Takahashi, Yao, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/267,770

(22) Filed: Mar. 15, 1999

(30) Foreign Application Priority Data

Mar. 16, 1998 (JP) .......................................... 10-084920
Aug. 4, 1998 (JP) .......................................... 10-232300

(51) Int. Cl.[7] .............................................. B08B 3/02
(52) U.S. Cl. ................... 134/57 R; 134/58 R; 134/148; 134/153; 134/199; 134/902; 134/198
(58) Field of Search .............................. 134/56 R, 58 R, 134/140, 148, 153, 149, 198, 199, 177, 902, 57 R

(56) References Cited

U.S. PATENT DOCUMENTS

| | | | | |
|---|---|---|---|---|
| 3,517,675 A | * | 6/1970 | Sadwith | |
| 3,953,265 A | * | 4/1976 | Hood | |
| 4,439,243 A | * | 3/1984 | Titus | |
| 4,685,975 A | * | 8/1987 | Kottman et al. | |
| 4,788,994 A | * | 12/1988 | Shinbara | |
| 5,238,878 A | * | 8/1993 | Shinohara | |
| 5,328,871 A | * | 7/1994 | Tanigawa et al. | |
| 5,351,360 A | * | 10/1994 | Suzuki et al. | 134/902 |
| 5,374,312 A | * | 12/1994 | Hasebe et al. | 134/153 |
| 5,706,843 A | * | 1/1998 | Matsuo | |
| 5,815,762 A | * | 9/1998 | Sakai et al. | 134/199 |
| 5,845,662 A | * | 12/1998 | Sumnitsch | 134/153 |
| 5,879,576 A | * | 3/1999 | Wada et al. | |
| 5,916,366 A | * | 6/1999 | Ueyama et al. | 134/902 |
| 5,927,303 A | * | 7/1999 | Miya et al. | |
| 5,927,305 A | * | 7/1999 | Shiba | 134/153 |
| 5,975,097 A | * | 11/1999 | Yonemizu et al. | |
| 5,975,098 A | * | 11/1999 | Yoshitani et al. | 134/148 |
| 6,003,527 A | * | 12/1999 | Netsu et al. | |
| 6,021,786 A | * | 2/2000 | Jun et al. | |
| 6,050,276 A | * | 4/2000 | Harada et al. | |
| 6,115,867 A | * | 9/2000 | Nakashima et al. | |
| 6,155,275 A | * | 12/2000 | Shinbara | |
| 6,221,766 B1 | * | 4/2001 | Wasserman | |

FOREIGN PATENT DOCUMENTS

| | | | | |
|---|---|---|---|---|
| JP | 62-188323 | * | 8/1987 | 134/902 |
| JP | 63-185029 | * | 7/1988 | 134/902 |
| JP | 4-304636 | * | 10/1992 | 134/902 |
| JP | 5-3184 | * | 1/1993 | |
| JP | 6-120184 | * | 4/1994 | |

* cited by examiner

*Primary Examiner*—Frankie L. Stinson
(74) *Attorney, Agent, or Firm*—Oblon, Spivak, McClelland, Maier & Neustadt, P.C.

(57) ABSTRACT

An apparatus for cleaning a substrate comprises a spin chuck for holding a substrate substantially horizontally a rotation driving mechanism for rotating the spin chuck, a lower nozzle having a plurality of liquid outlet ports facing both a peripheral portion and a center portion of a lower surface oaf the substrate held by the spin chuck, a process liquid supply mechanism for supplying a first process liquid to the lower nozzle, and a controller for controlling operations of the process liquid supply mechanism and the rotation driving mechanism, individually, in which the controller controls the rotation driving mechanism to rotate the spin chuck and controls the process liquid supply mechanism to supply a first process liquid to the lower nozzle, thereby outputting the first process liquid toward the peripheral portion and the center portion of the lower surface of the substrate.

14 Claims, 10 Drawing Sheets

SUBSTRATE CLEANING APPARATUS AND METHOD

BACKGROUND OF THE INVENTION

The present invention relates to a substrate cleaning apparatus and method of cleaning both surfaces of a substrate such a semiconductor wafer or an LCD substrate.

In a process for manufacturing semiconductor devices, it is very important to maintain both surfaces of a semiconductor wafer at clean conditions. Therefore, it is necessary to remove contaminants, such as particles, organic substances, and metallic ions, attached to both surfaces of the semiconductor wafer. The contaminants are removed from front and rear surfaces of the semiconductor wafer by using a single-processing apparatus for cleaning both surfaces as disclosed, for example, in U.S. patent application Ser. No. 09/135,478 (filed on Aug. 17, 1998).

In a conventionally used cleaning apparatus 100 shown in FIG. 1, a wafer W is horizontally held by a peripheral holding member 103. While the wafer W is rotated by means of a spin chuck 101, a process liquid is supplied to the center portion of an upper surface (front surface) of the wafer W from an upper nozzle (not shown); at the same time, a process liquid is supplied to the center portion of a lower surface (rear surface) of the wafer W from a lower nozzle 102. However, the process liquid 104 supplied to the lower surface of the wafer W falls down from the wafer W before it reaches to the peripheral portion of the wafer W. As a result, the process liquid 104 may not be supplied to the peripheral portion of the wafer W in a sufficient amount. In addition, the surfaces of the wafer W are hydrophobic, so that the process liquid 104 is likely to be repelled from the lower surface of the wafer W and fall off. It follows that the lower peripheral portion of the wafer W is washed insufficiently. In particular, when a large-sized wafer (e.g., 8 or 12 inch diameter) is used, the process liquid 104 rarely reaches the lower peripheral portion of the wafer W, with the result that the lower peripheral portion is cleaned but incompletely.

In a step of manufacturing a semiconductor device, a silicon oxide film (insulating film) is often formed on the wafer W. The silicon oxide film (insulating film) is, however, an unnecessary film for a non-pattern formation region (rear surface) of the wafer W. The insulating film must be removed from the rear surface of the wafer. However, when the insulating film is tried to remove from the rear surface of the wafer, the pattern formed on the front surface is sometimes damaged.

BRIEF SUMMARY OF THE INVENTION

An object of the present invention is to provide a substrate cleaning apparatus and method capable of supplying a process liquid in a sufficient amount even to a peripheral portion of a rear surface of the substrate, and uniformly cleaning the entire rear surface of the substrate, without damaging an upper surface of the substrate.

According to the present invention, there is provided an apparatus for cleaning the substrate, comprising:

a spin chuck for holding a substrate substantially horizontally;

a rotation driving mechanism for rotating the spin chuck;

a lower nozzle having a plurality of liquid outlet ports facing both a peripheral portion and a center portion of a lower surface of the substrate held by the spin chuck;

a process liquid supply mechanism for supplying a first process liquid to the lower nozzle; and a controller for controlling operations of the process liquid supply mechanism and the rotation driving mechanism, individually, in which the controller controls the rotation driving mechanism to rotate the spin chuck and controls the process liquid supply mechanism to supply the first process liquid to the lower nozzle, thereby outputting the first process liquid toward the peripheral portion and the center portion of the lower surface of the substrate.

According to the present invention, there is provided a method of cleaning a substrate comprising the steps of:

(a) holding a substrate rotatably and substantially horizontally;

(b) rotating the substrate; and (c) supplying a first process liquid from a lower nozzle to both a peripheral portion and a center portion of a lower surface of the substrate held by a spin chick, substantially simultaneously, and supplying a second process liquid from an upper nozzle to an upper surface of the substrate held.

In this case, the second process liquid is pure wafer for protecting the upper surface of the substrate. The first process liquid is an etching solution for dissolving and removing a thin film coated over the lower surface of the substrate. More specifically, the first process liquid is one selected from the group consisting of an ammonia/hydrogen peroxide solution mixture, an hydrochloric acid/hydrogen peroxide solution mixture, and an aqueous hydrofluoric acid solution.

According to the present invention, the first process liquid is supplied from the lower nozzle uniformly to the region extending from the center portion to any peripheral portion of the lower surface of the substrate. It is therefore possible to uniformly dissolve and remove the oxide film from the lower surface of the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
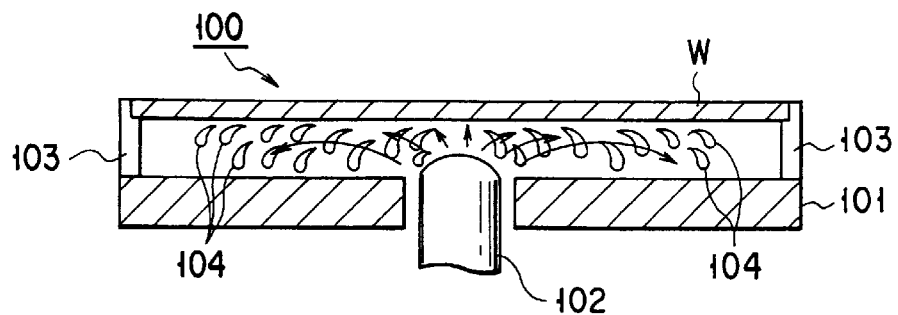
FIG. 1 is a cross-sectional view of a gist portion of a conventionally-used cleaning apparatus.
Figure 2:
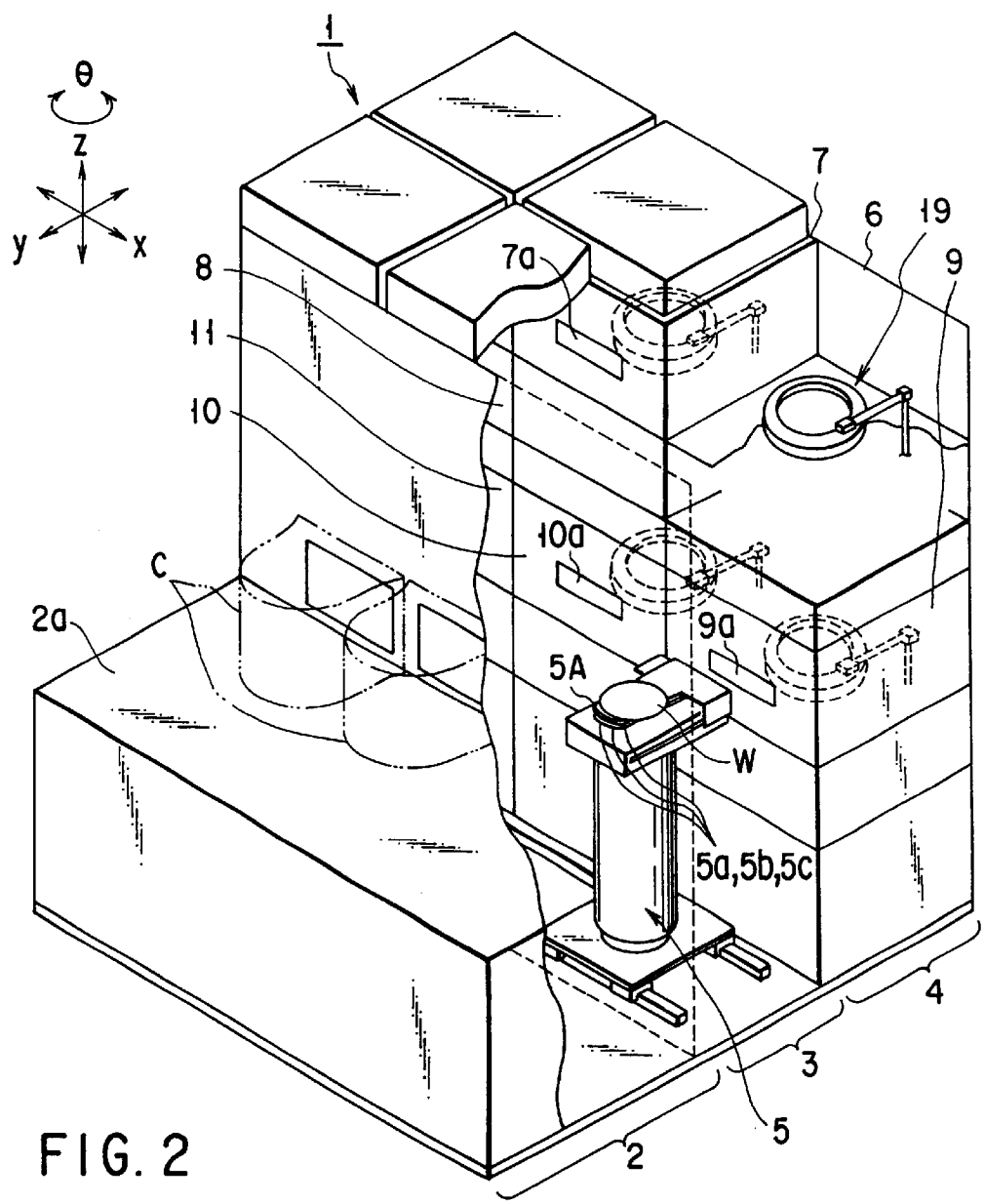
FIG. 2 is a perspective view of a wafer cleaning system, partly cut away, for showing an inner structure.

Now, various preferred embodiments of the present invention will be explained with reference to the accompanying drawings.

A cleaning system 1 has a load/unload section 2 for loading/unloading a cassette C storing one lot of semiconductor wafers W (25 sheets). A transportation passage (not shown) for a cassette transport robot is provided in front of the load/unload section 2. In the load/unload section 2, a mounting table 2a extending in an X-direction is arranged. On the mounting table 2a, for example, three cassettes C are mounted. A transport section 3 is provided along the mounting table 2a. A transport arm mechanism 5 is placed within the transport section 3. The transport arm mechanism 5 has an arm portion A consisting of three arms 5a, 5b, 5c. The transport arm mechanism 5 has a back-and-forth moving mechanism for moving each of arms 5a, 5b, 5c, back and forth, an X-axis moving mechanism for moving the arm portion 5A in the X-axis direction, a Z-axis moving mechanism for moving the arm portion 5A in a Z-axis direction, and a θ-rotation mechanism for rotating the arm portion 5A around the Z-axis.

The processing section 4 is arranged at the rear side of the transporting section 3 and has six processing units 6–11. Loading/unloading ports 6a–11a are provided in front surfaces of the processing units 6–11, respectively. The loading/unloading ports 6a–11a are opened/closed by a shutter (not shown). The wafer W is loaded into/unloaded from each of the processing units 6–11 by the transport arm mechanism 5 through the loading/unloading ports 6a–11a, respectively. The processing units 6 and 9, which are adjacent units vertically arranged, are responsible for washing the wafer W with the same type of chemical solution. The processing units 7 and 10, which are adjacent units vertically arranged, are responsible for washing the wafer W with the same type of chemical solution. The processing units 8 and 11, which are adjacent units vertically arranged, are responsible for washing the wafer W with the same type of chemical solution. At a back surface side of the processing section 4, a chemical solution supply unit (not shown) and a waste fluid collecting unit (not shown) are arranged.

Now, referring to FIGS. 3–7, the cleaning unit for removing an oxide film formed on the rear surface of a wafer without affecting the semiconductor device formed on the upper surface of the wafer. Since the cleaning units 19 of the processing units 6–11 are substantially equal to each other, the cleaning unit 19 placed in the first processing unit 6 will be representatively explained.

Figure 3:
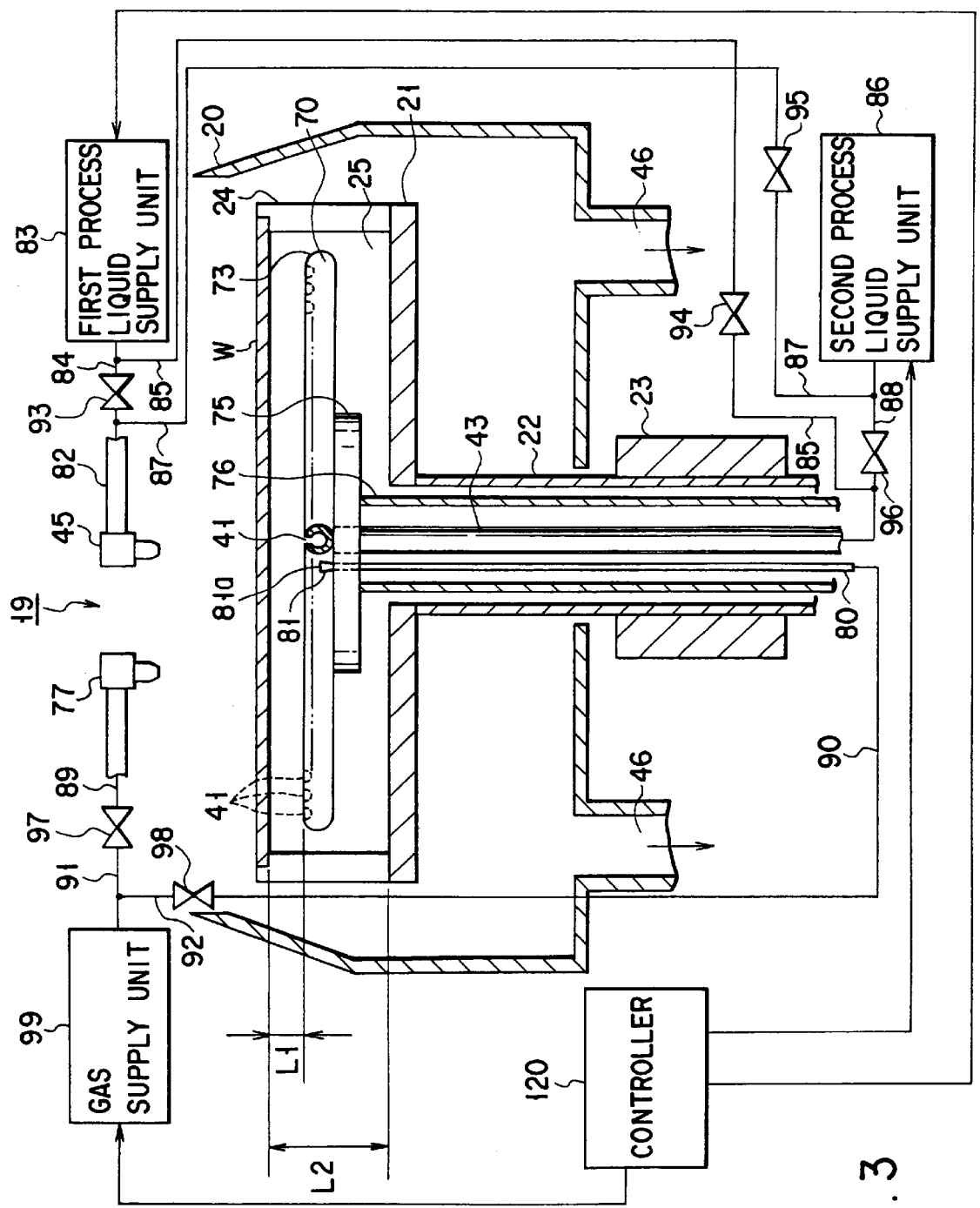
FIG. 3 is a cross sectional view of a cleaning apparatus according to a first embodiment of the present invention, accompanying a block diagram of peripheral elements.

As shown in FIG. 3, the cleaning unit 19 has a cup 20, a spin chuck 21, various types of nozzles 45, 73, 77, 81, first and second process liquid supply units 83, 86, a gas supply unit 99, and a controller 120. The cup 20 surrounds a spin chuck 21 and receives liquid and mist scattered from the wafer. A plurality of drainage passages 46 are formed in the bottom surface of the cup 20. The drainage passages 46 communicate with a waste fluid tank (not shown) and an exhaust unit to discharge the received waster fluid and mist.

A rotatory hollow shaft 22 passes through the center of the bottom surface of the cup 20. The upper end of the shaft 22 is connected to the spin chuck 21. The rotatory hollow shaft 22 is rotated directly by a motor 23. A plurality of mechanical chucks 24 are arranged so as to stand in the upper peripheral portion. The wafer W is held by the mechanical chucks 24. The rotatory hollow shaft 22 is connected to a liftable mechanism (not shown) driven by a cylinder (not shown) to move the spin chuck 21 up and down.

Figure 5:
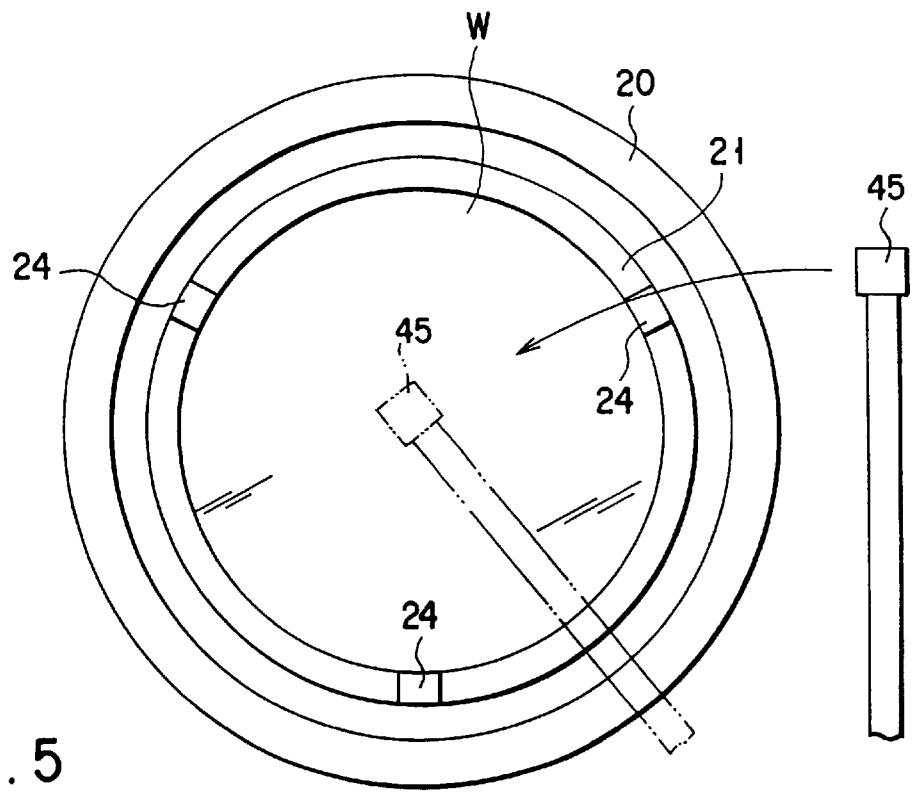
FIG. 5 is a schematic plan view of the cleaning apparatus.

As shown in FIG. 3 and FIG. 5, two upper nozzles 45, 77 are supported by the corresponding moving mechanisms (not shown) so as to move between a home position and an operation position. In the home positions, nozzle stand-by regions (not shown) are formed to allow the upper nozzles 45, 77 to stand-by. The operation positions for the upper nozzles 45, 77 are right above the wafer held by the spin chuck 21.

Figure 6:
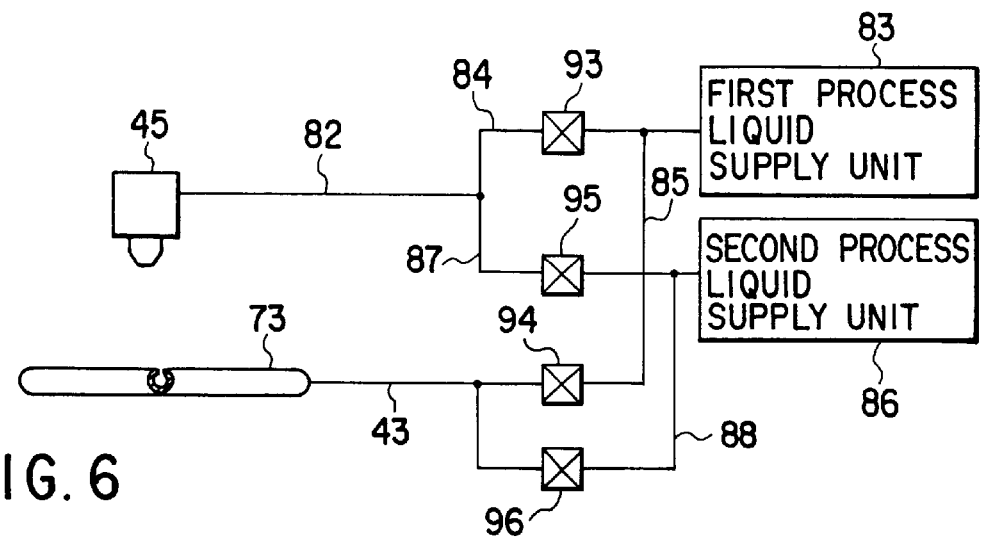
FIG. 6 is a block diagram showing a liquid supply route for supplying a process liquid to a cleaning nozzle according to the first embodiment.

As shown in FIG. 6, the nozzle 45 communicates with a first process liquid supply unit 83 through passages 82, 84 and communicates with a second process liquid supply unit 86 through passages 82, 87. A valve 93 is provided in the passage 84. A valve 96 is provided in the passage 88. Furthermore, the passage 43 communicates with the passage 84 through a first bypass passage 85. The passage 82 communicates with the passage 88 through a second bypass passage 87. The first bypass passage 85 is equipped with a valve 94. The second bypass passage 87 is equipped with a valve 95. The open/shut operations of the valves 93, 94, 95, 96 are individually controlled by a controller 120. The first process liquid supply unit 83 houses a process liquid supply source and a flow rate control mechanism. Pure wafer is contained as a process liquid for supplying on the front surface of the substrate, in the process liquid supply source of the unit 83.

Figure 7:
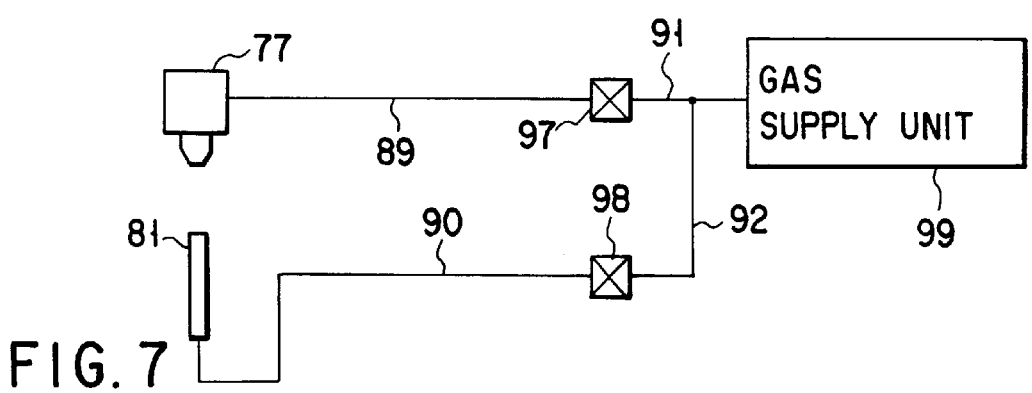
FIG. 7 is a block diagram showing a gas supply route for supplying a gas to a drying nozzle according to the first embodiment.
Figure 8:
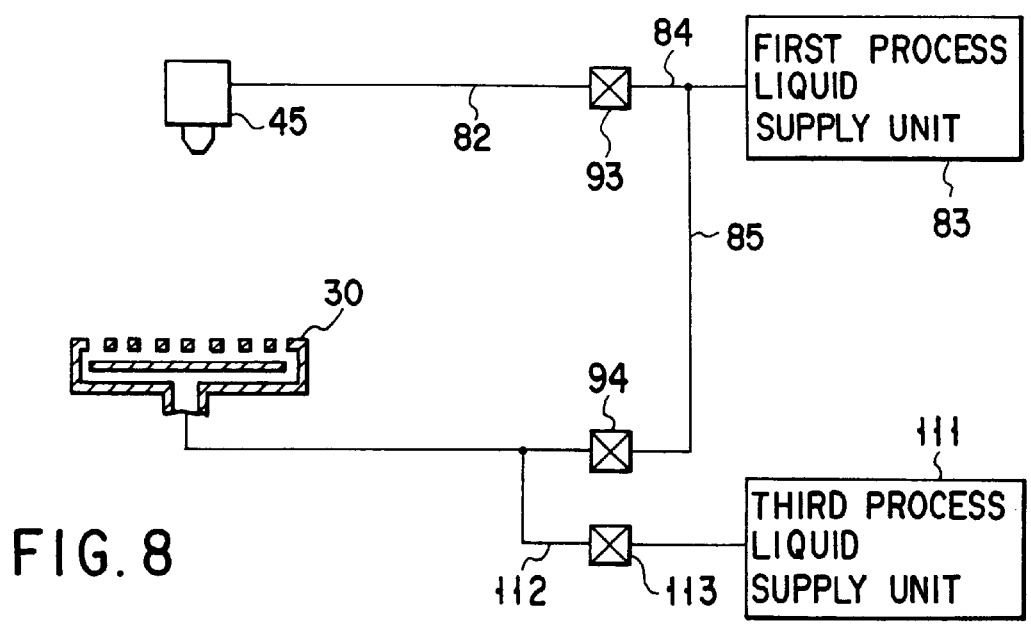
FIG. 8 is a block diagram showing a liquid supply route for supplying a process liquid to a cleaning nozzle according to another embodiment.

As shown in FIG. 7, the upper nozzle 77 communicates with a gas supply unit 99 through passages 89, 91. The gas supply unit 99 houses a gas supply source and a flow rate control mechanism which are controlled by the controller 120. The gas supply source of the unit 99 contains a non acidic gas such as nitrogen gas. Note that a valve 97 is interposed between the passage 89 and 91 from the gas supply unit 99 to the nozzle 77. A dehumidifier may be fit to the passages 89, 91 to dry the gas. Furthermore, a heater may be fitted to the passages 89, 91 to heat the gas.

As shown in FIG. 3, two lower nozzles 73, 81 are arranged immediately under the wafer W held by the spin chuck 21. Each of the outlet ports 41, 81a is faced to the lower surface (non pattern formation region) of the wafer. These two lower nozzles 73, 81 are attached to a supporting disk 75 supported by the hollow supporting shaft 76.

As shown in FIG. 6, the lower nozzle 73 communicates with the second process liquid supply unit 86 through the passages 43, 88 and communicates with the first process liquid supply unit 83 through the passages 43, 85. The second process liquid supply unit 86 houses a chemical solution supply source and a flow rate control mechanism which are controlled by the controller 120. The chemical solution supply unit of the unit 86 contains, for example, an ammonia/hydrogen peroxide solution mixture (APM solution), a hydrochloric acid/hydrogen peroxide solution mixture (HPM solution) or an aqueous hydrofluoric acid solution (DHF solution). The process liquid supply passages 82, 84, 85, 87, 88 are equipped with filters (not shown) for removing impurities and foreign substances.

As shown in FIG. 7, the lower nozzle 81 communicates with the gas supply unit 99 through passages 90, 92. The lower nozzle 81 has a gas outlet port 81a for spraying a gas toward the lower surface of the wafer W. The gas flow passages 90, 92 are equipped with a valve 98 controlled by the controller 120, which controls the amount of gas to be supplied to the lower nozzle 81.

Figure 4:
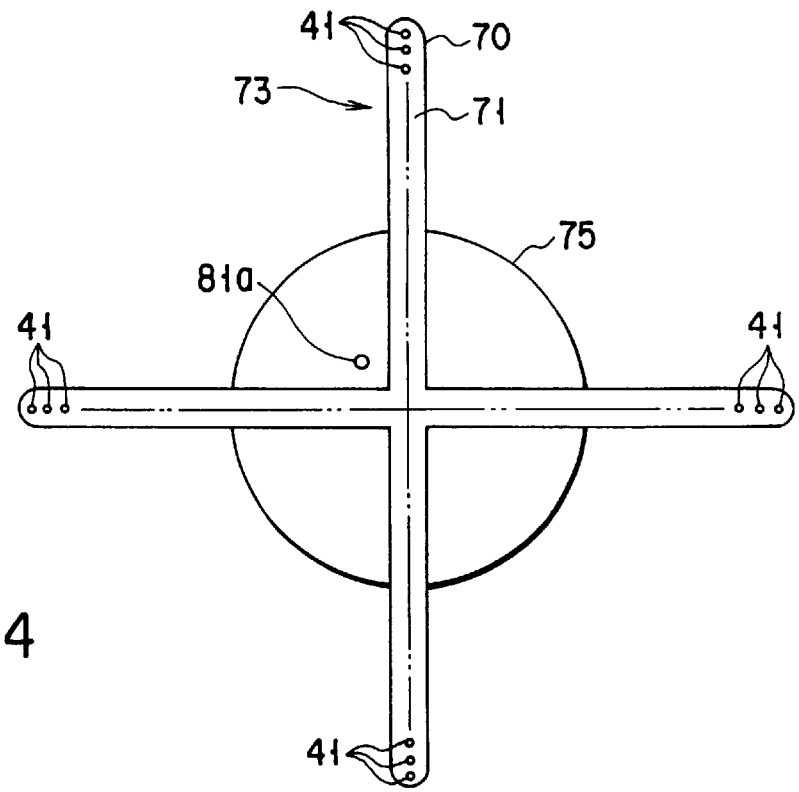
FIG. 4 is a plan view of a lower nozzle as viewed from an upper side.

As shown in FIG. 4, the lower nozzle 73 is a tube 70 (consisting of four branched tubes), having a cruciform plan view. A liquid inlet port communicating with the passage 43 is formed at a point of the intersection (the cruciform) of the lower nozzle 73. Numerous holes 41 are formed in the upper surface of the four branched (cruciform) tubes 70 and face the lower surface of the wafer W. The holes 41 are arranged at regular intervals along a longitudinal portion of the tube 70. Note that the distance L1 from the lower nozzle 73 to the lower surface of the wafer W desirably falls within the range of 2–20 mm. The distance L2 (the height of a lower space 25) from the upper surface of the spin chuck 21 to the lower surface of the wafer W desirably falls within the range of 20–50 mm.

When the process liquid is introduced into the lower nozzle 73, the process liquid is equally distributed to the four branched tubes 70. The process liquid is sprayed simultaneously toward the peripheral portion and the center portion of the lower surface of the wafer. The passage 43 communicating with these holes 41 is inserted into the hollow supporting shaft 76, which is further inserted into a rotatory hollow shaft 22. In other words, the nozzles 73, 81 pass through the hollow supporting shaft 76 and opened at the space 25. Note that the controller 120 controls open/shut operations of the valves 93, 94, 95, 96 to switch supply of the process liquid to the lower nozzle 73 between the first (83) and second process liquid supply unit 86. To describe more specifically, the valve 96 is closed and the valve 94 is opened to thereby switch the route to the lower nozzle 73 from the passages 88, 43 to the passages 85, 43 and switch supply of the process liquid to the lower nozzle 73 from a chemical cleaning liquid (DHF solution, APM solution or HPM solution) to a rinse solution (pure wafer). If the valves 95, 96 are closed and the valves 93, 94 are opened, the rinse solution (pure water) can be supplied simultaneously to the upper and lower nozzles 45, 73.

Note that the liquid inlet port is not always communicated with the point of intersection of the lower nozzle 73. The inlet port may be communicated with tip portions of the four branched tubes 70, or two of them.

Alternatively, a plurality of lower nozzles 81 may be arranged so as to face the lower surface of the wafer W. In this case, it is desirable to define the direction of the gas spray ports of the nozzles 81 in such a way that gas flows sprayed from the nozzles 81 are not interfered with each other. This is because if the gas flows are hit to each other, a turbulent flow is generated, decreasing a drying efficiency.

The process liquid is supplied from the cruciform nozzle 73 of the aforementioned embodiment uniformly to the entire lower surface of the wafer W, although the space occupied by the nozzle is small.

Figure 9:
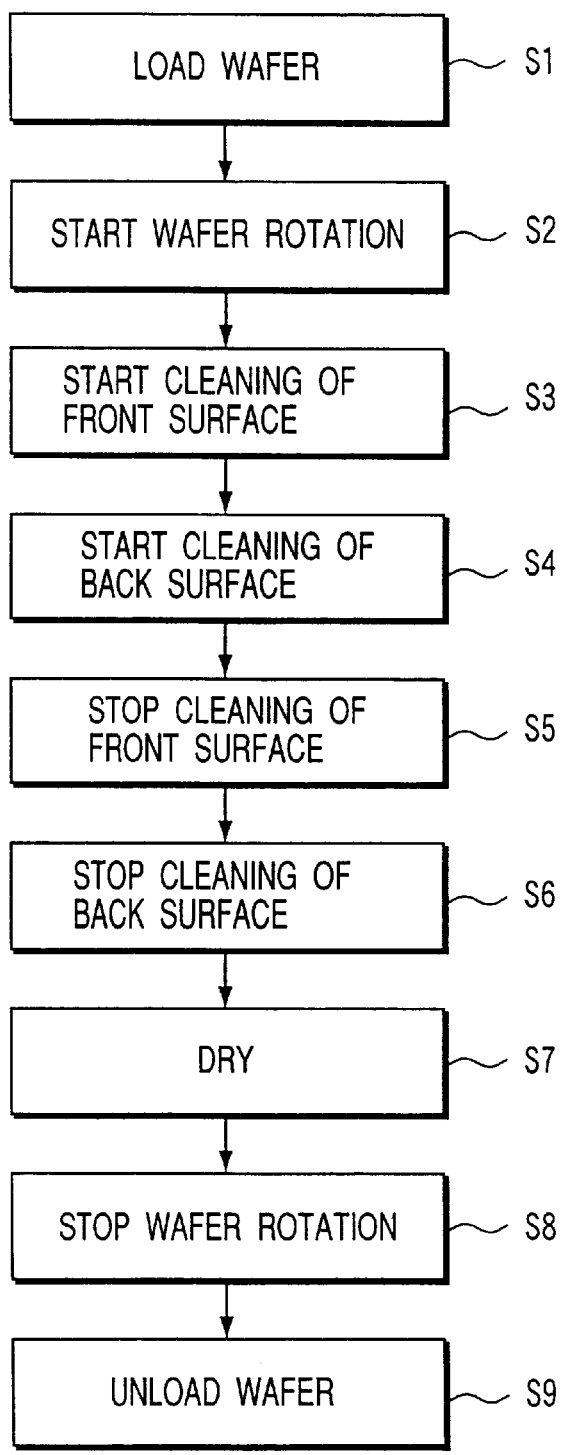
FIG. 9 is a flow chart showing the steps for cleaning both surfaces of a substrate.

Now, referring to FIG. 9, we will explain how to wash and clean the both surfaces of the wafer W by using the aforementioned substrate cleaning apparatus.

First, the cassette C is loaded into the load/unload section 2 by the transport robot (not shown). In the cassette C, 25 sheets of silicon wafers W (8 inch or 12 inch diameter) are stored. A pattern is formed on the front surface of each of the wafers W. An identification code having data of processing conditions for a specific lot, recorded thereon, is displayed at an appropriate portion of the cassette C. The identification code is read by an optical sensor (not shown) and the read data is input into the controller 120. The controller sends instruction signals to the transport arm mechanism 5 and each of the processing units 6–11 on the basis of the input data. The transport arm mechanism 5 and the processing units 6–11 are operated in accordance with the instruction signals.

The wafer W is taken out from the cassette C by the transport arm mechanism 5, and transported to the processing unit 7 of the processing section 4. Then, the shutter of the unit 7 is moved down to load the wafer W into the process unit 7 through the loading/unloading port 7a (Step S1).

After transferring of the wafer W onto the spin chuck 21, the arm 5b is withdrawn and the loading/unloading port 7a is closed. Subsequently, rotation of the wafer W is initiated by the spin chuck 21 (Step S2). Then, the valves 93, 94 are opened and the valves 95, 96 are closed to supply APM solution to the upper surface of the wafer W from the upper nozzle 45 (Step S3) and to supply an APM solution serving as a removing liquid from the lower surface of the wafer W from the lower nozzle 73 (Step 4). The rotation speed of the spin chuck 21 ranges from 10 to 30 rpm. The lower side supply amount of the APM solution is 0.5 to 4.0 L/min. The upper side supply amount of the APM solution is 0.5 to 4.0 L/min. When the APM solution is simultaneously output from the output holes 41 toward the peripheral portion and the center portion of the wafer W, the silicon oxide film coated over the rear surface of the wafer W is uniformly etched and removed therefrom.

The valves 93–96 are closed and the supply of the APM solution to the rear surface of the wafer W is terminated (Step S5). Simultaneously, the supply of the APM solution to the front surface is terminated (Step S6). After completion of the rear surface cleaning, the valves 93, 94 are closed and the valves 95, 96 are opened to supply pure wafer to the upper surface of the wafer W from the upper nozzle 45; at the same time, pure wafer is supplied to the lower surface of the wafer W from the lower nozzle 73. In this manner, both surfaces of the wafer W are cleaned.

Subsequently, the valves 97, 98 are opened and nitrogen gas is sprayed toward the upper and lower surfaces of the wafer W in rotatory motion, from the upper and lower nozzles 77, 81. In this manner, both surfaces of the wafer W are dried (Step S7). In the drying step S7, the rotation speed of the spin chuck 21 is further increased to actively remove the attached liquid from the wafer W. Note that the inner space of the cup 20 is forcibly evacuated by an exhaust apparatus (not shown). In this manner, both surfaces of the wafer W are dried up.

When the wafer W is completely dried up, the rotation of the spin chuck 21 is terminated (Step S8). Then, the shutter is opened, the transport arm 5c is inserted into the processing unit 7 through the loading/unloading port 7a, and the wafer W is unloaded from the processing unit 7 by the transfer arm 5c. Subsequently, the wafer W is transported to a next processing unit 8, in which both surfaces of the wafer W are washed with, for example, the aqueous hydrofluoric acid solution (DHF cleaning). After the DHF cleaning, the wafer W is rinsed with pure water and rotated by the spin chuck 21 at a high speed to remove the attached liquid from the wafer W. Simultaneously, nitrogen gas is sprayed onto the wafer W to dry both surfaces.

Thereafter, the shutter is opened to unload the wafer W from the processing unit 8 by the transport arm 5a. The substrate transport arm mechanism 5 is turned again to the loader/unloader 2 from the processing section 4. The substrate transport arm mechanism 5 then moves the transport arm 5a forward to store the wafer W into the cassette C. In this way, the first wafer W1 to the 25th wafer W25 washed successively, are stored into the cassette C, and then, the transport robot (not shown) unloads the cassette C out of the system 1 through the loader/unloader section 2 and transports the cassette C to a next process (Step 9).

Now, referring to FIGS. 8, 10–12, a second embodiment of the present invention will be explained. Note that explanation for the same structural elements of the second embodiment as in the first embodiment will be omitted.

Figure 10:
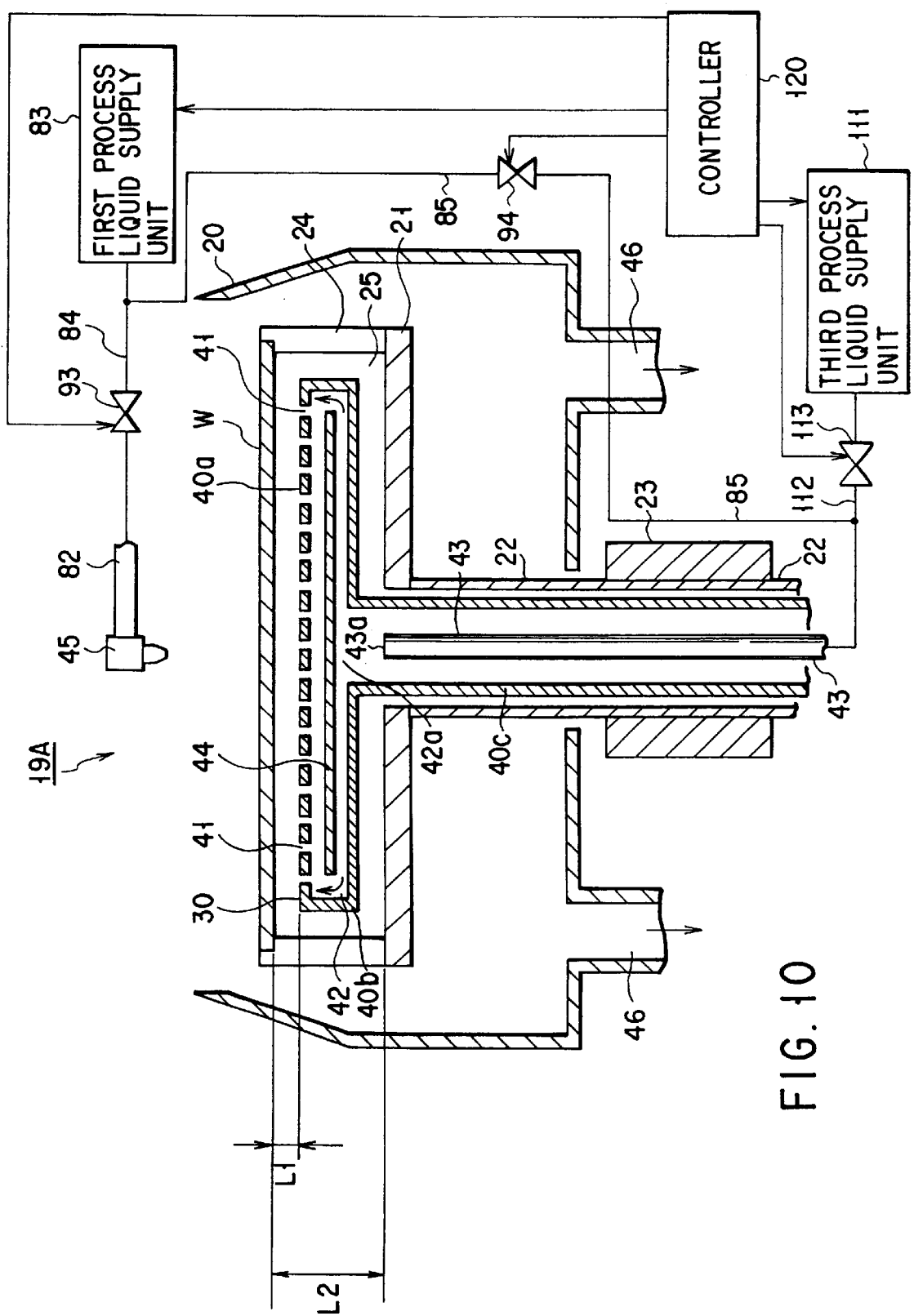
FIG. 10 is a cross sectional view of a cleaning apparatus according to another embodiment of the present invention, accompanying a block diagram of peripheral elements.

As shown in FIG. 10, the cleaning apparatus 19A has a lower nozzle 30 which includes a cup 20, a spin chuck 21, and a liquid reservoir chamber 42, an hindrance board 44, an upper nozzle 45, first and third process liquid supply units 83, 111, and a controller 120.

The third process liquid supply unit 111 houses a chemical solution supply source and a flow rate control mechanism which are controlled by the controller 120. The chemical solution supply source of the apparatus 111 contains an ammonia/hydrogen peroxide solution mixture (APM solution), a hydrochloric acid/hydrogen peroxide solution mixture (HPM solution) or an aqueous hydrofluoric acid solution (DHF solution). Note that pure wafer serving as a protect liquid is contained in a liquid supply source of the first process liquid supply unit 83.

A rotatory hollow shaft 22 passes through the center bottom of the cup 20. The upper end of the rotatory hollow shaft 22 is connected to the spin chuck 21. The rotatory hollow shaft 22 is directly rotated by a motor 23. A plurality of mechanical chucks 24 are arranged so as to stand at the upper peripheral surface of the spin chuck 21. The wafer W is held by these mechanical chucks 24. Furthermore, the rotatory hollow shaft 22 is connected to a liftable cylinder mechanism (not shown) to move the spin chuck 21 up and down.

In the rotatory hollow shaft 22, a hollow support shaft 40c is inserted. In the hollow support shaft 40c, a process liquid supply pipe 43 is further inserted. The supply port 43a of the process liquid supply pipe 43 is formed so as to spray the liquid upward. The upper end of the hollow support shaft 40c is connected to the bottom of the lower nozzle main body 40b. The lower end (not shown) of the hollow support shaft 40c is connected to the liftable cylinder mechanism (not shown).

Figure 11:
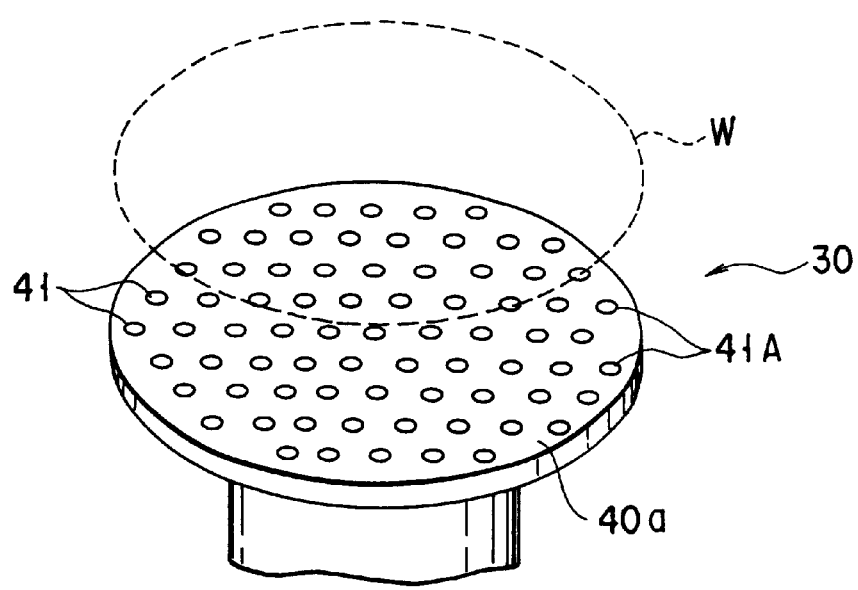
FIG. 11 is a perspective view of a lower nozzle according to a first embodiment.

As shown in FIG. 11, the upper portion 40a of the lower nozzle 30 is flat. The size and shape of the upper portion 40a correspond to those of the wafer W. Numerous liquid outlet holes 41A are formed in the nozzle upper portion 40a. The liquid outlet holes 41 are not localized in a specific region of the nozzle upper portion 40a but present uniformly over the entire nozzle upper portion 40a. By virtue of this, the process liquid can be supplied uniformly to the entire lower surface of the wafer W. The holes 41 are arranged at regular intervals along a longitudinal portion of each tube 70. The distance L1 from the lower nozzle 73 to the lower surface of the wafer W desirably falls within the range of 2 to 20 mm. The distance L2 (height of a lower space 25) from the upper surface of the spin chuck 21 to the lower surface of the wafer W desirably falls within the range of 20 to 50 mm. The diameters of the liquid outlet ports 41A desirably fall within the range of 0.5 to 3.0 mm, and the interval (pitch) between adjacent holes 41 desirably falls within the range of 4 to 30 mm.

Figure 12:
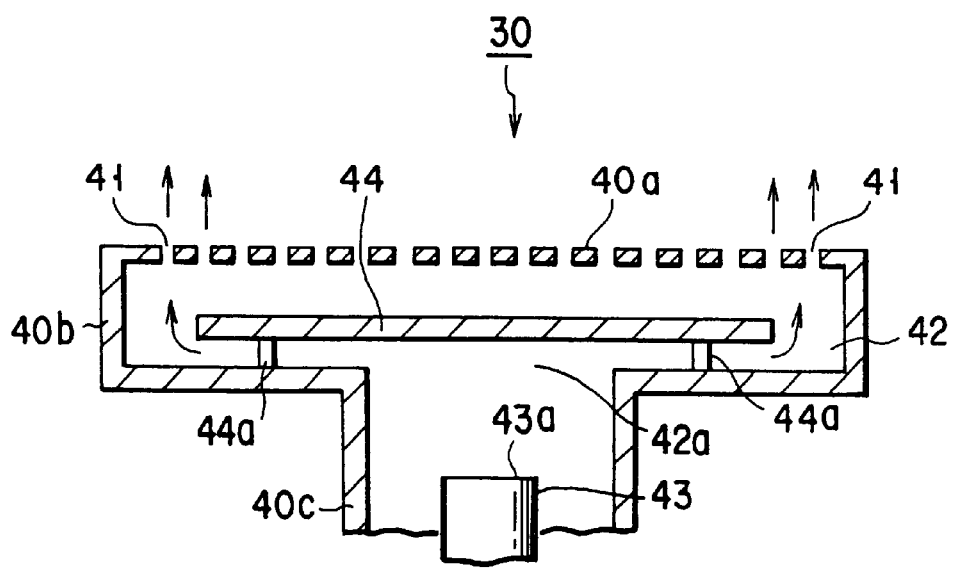
FIG. 12 is a longitudinal sectional view of the lower nozzle according to the first embodiment.

As shown in FIG. 12, within the nozzle main body 40b, the liquid reservoir chamber 42 is formed which communicates with the liquid outlet holes 41. The liquid reservoir chamber 42 communicates with the hollow portion of the hollow support shaft 40c through a communication opening 42a. In the liquid reservoir chamber 42, the hindrance board 44 is placed. The hindrance board 44 is supported by a plurality of support rods 44 and arranged so as to face a liquid outlet hole formation region 41A. The process liquid is introduced from a supply port 43a, passed through the communication opening 42a, and hits to the hindrance board 44. Then, the process liquid is dispersed from the center region of the liquid reservoir chamber 42 toward the peripheral region thereof, reaches around the upper portion of the hindrance board 44, and output upward trough numerous holes 41A. By virtue of the presence of the hindrance board 44, supply pressure of the process liquid is equalized, so that the process liquid is output from the center holes 41 and the peripheral holes 41 at the same flow rate.

As shown in FIG. 10, the upper nozzle 45 communicates with the first process liquid supply unit 83 through passages 82, 84 and communicated with the third process liquid supply unit 111 through passages 82, 85 and 112. A valve 93 is interposed between the passage 82 and the passage 84. A bypass passage 85 is equipped with a valve 94. A passage 112 is equipped with a valve 113. The open/shut operation of each of the valves 93, 94, 113 is controlled by the controller 120. Filters (not shown) are attached to the process liquid supply routes 82, 84, 85, 87, 112 to remove impurities and foreign substances from the process liquid.

Figure 19A:
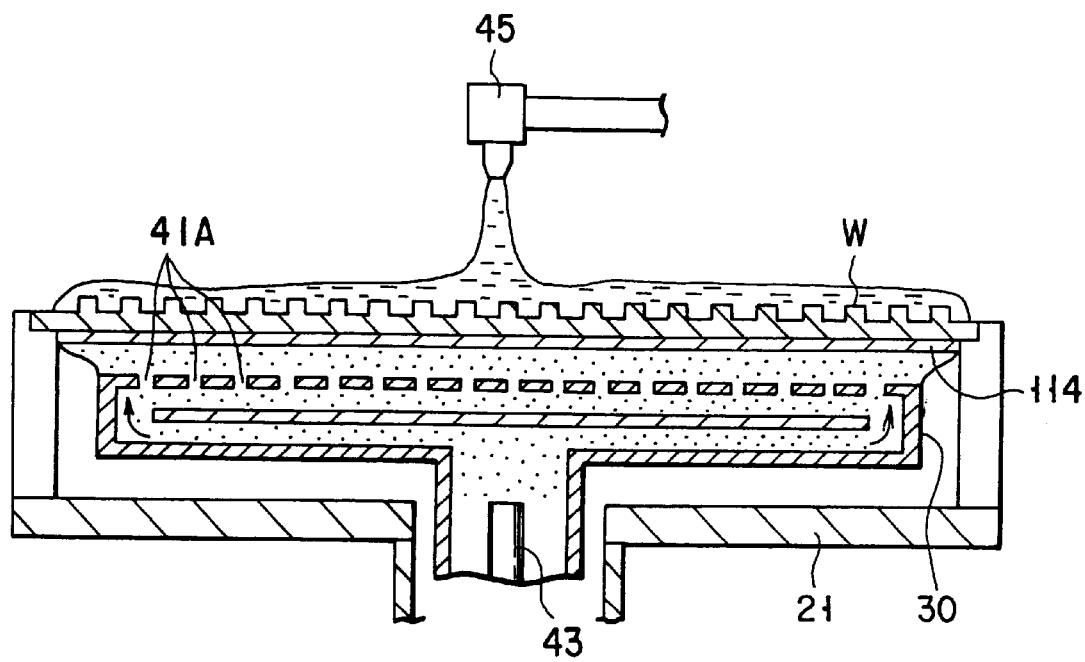
FIGS. 19A and 19B are perspective sectional views respectively showing a wafer and a cleaning apparatus during washing both surfaces.
Figure 19B:
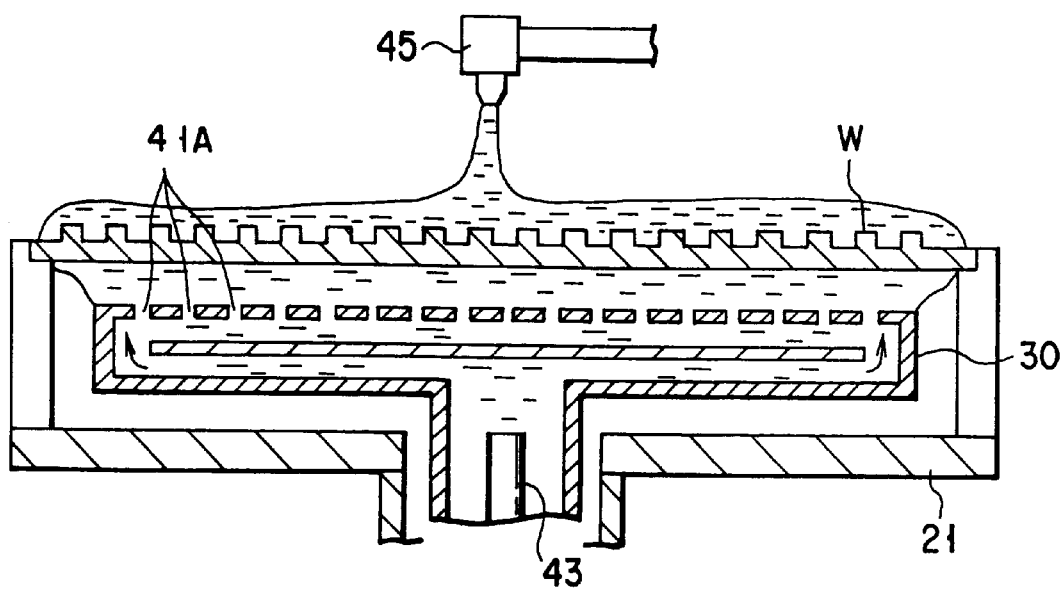

Now, referring to FIGS. 19A and 19B, we will explain how to clean the semiconductor wafer W by using the cleaning apparatus 19A.

The wafer W is loaded into the process unit 9 having a cleaning apparatus 19A by the transport arm 5b. The wafer W is then transferred from the transport arm 5b to the spin chuck 21 and held by the mechanical chuck 24. The spin chuck 21 is rotated by the controller 120 at, for example, 20 rpm. Subsequently, the protect liquid (pure water) is supplied to the upper surface of the wafer W from the upper nozzle 45. The removal solution (hydrofluoric acid solution) is supplied to the lower surface of the wafer W from the lower nozzle 30. As a result, the silicon oxide film is removed from the lower surface (rear surface) of the wafer W.

Thereafter, a valve 113 is opened. Simultaneously, pure wafer is supplied to the upper nozzle 45 and the lower nozzle 30 from the third process liquid supply unit 111 through the bypass route 85 to rinse both surfaces of the wafer W.

After rinse, the rotation speed of the wafer W is increased to shake off the attached liquid from the wafer W to dry up the wafer W. Note that the process liquid for use in washing the lower surface of the wafer W may be either a chemical washing solution (DHF solution) or a rinse solution (pure wafer) in this embodiment.

The rotation of the spin chuck 21 is terminated and the shutter is opened. Then, wafer W is unloaded from the processing unit by the transfer arm 5a. The substrate transport arm mechanism 5 transports the wafer W to the loader/unloader section 2 to store the wafer W into the cassette C. When the first wafer W1 to the 25th wafer W25 successively washed are thus stored in the cassette C, the transfer robot (not shown) unloads the cassette C out of the system 1 through the loader/unloader section 2 and transfer the cassette C to a next processing unit.

Referring to FIGS. 13–18, a lower nozzle of another embodiment will be explained.

Figure 13:
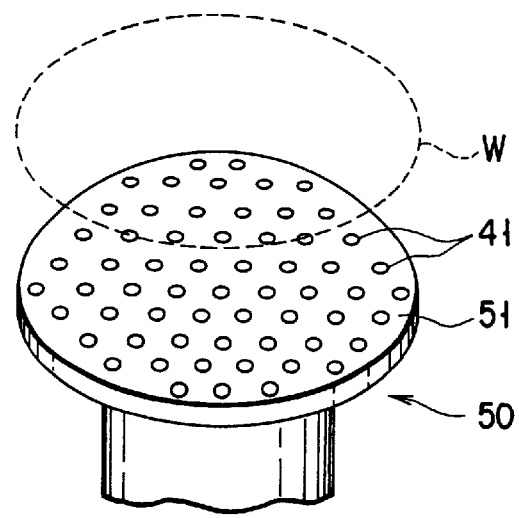
FIG. 13 is a perspective view of a lower nozzle according to a second embodiment.
Figure 14:
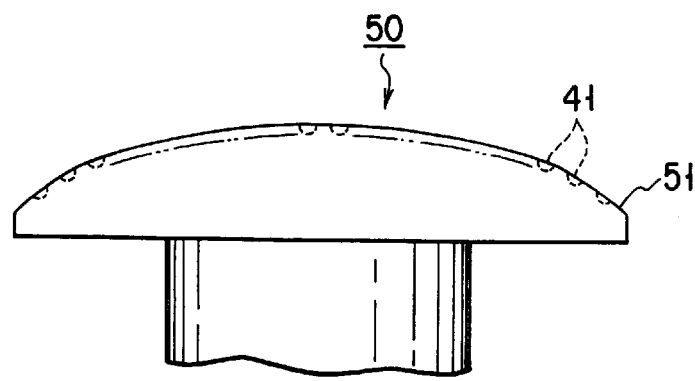
FIG. 14 is a side view of the lower nozzle according to the second embodiment.

As shown in FIGS. 13 and 14, the upper portion 51 of the lower nozzle 50 may be formed in a convex form so that the center portion of the nozzle is higher than the peripheral portion thereof. The holes 41 may be formed over the entire surface of the nozzle upper portion 51 so as to supply and spray the process liquid uniformly to the entire surface of the lower surface of the wafer W. Due to the convex-form lower nozzle 50, the process liquid sprayed does not stay the nozzle upper portion 51, with the result that the nozzle upper portion 51 is maintained clean.

Figure 15:
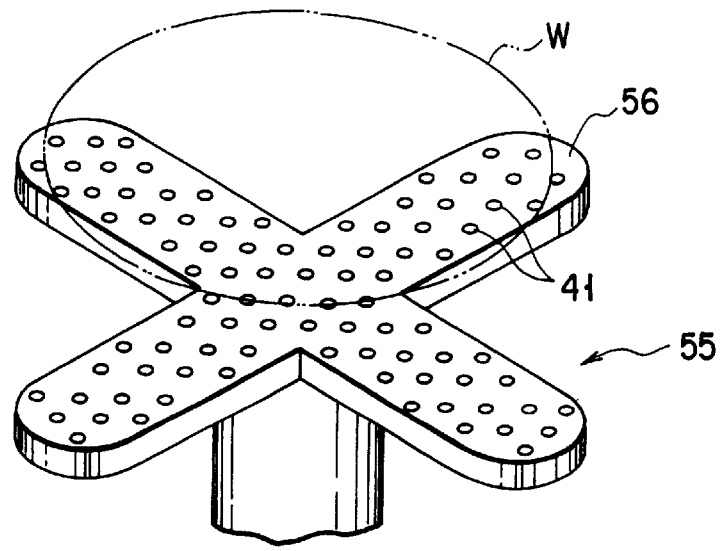
FIG. 15 is a perspective view of the lower nozzle according to a third embodiment.

As shown in FIG. 15, the lower nozzle may be formed in virtually a cruciform. The upper portion 56 of the nozzle is flat. The holes 41 are formed over the entire surface of the nozzle upper portion 56.

Figure 16:
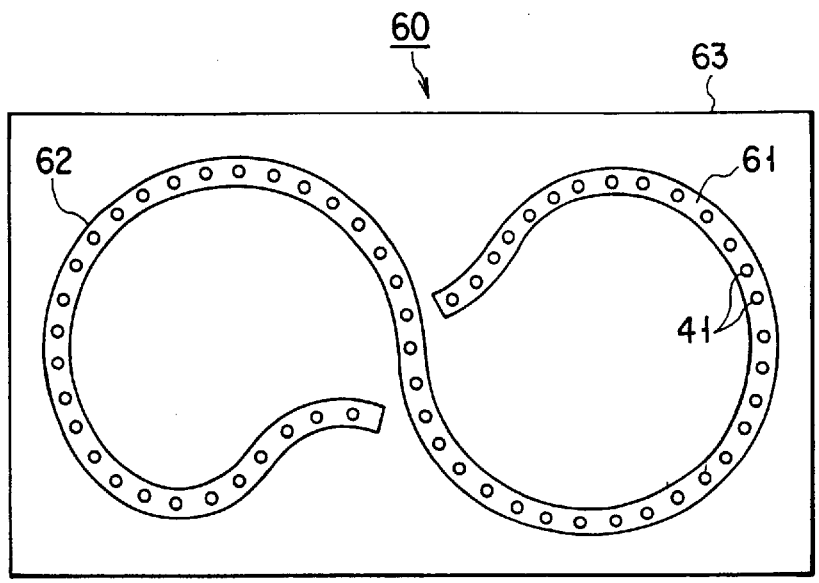
FIG. 16 is a plan view of a lower nozzle according to a fourth embodiment.
Figure 17:
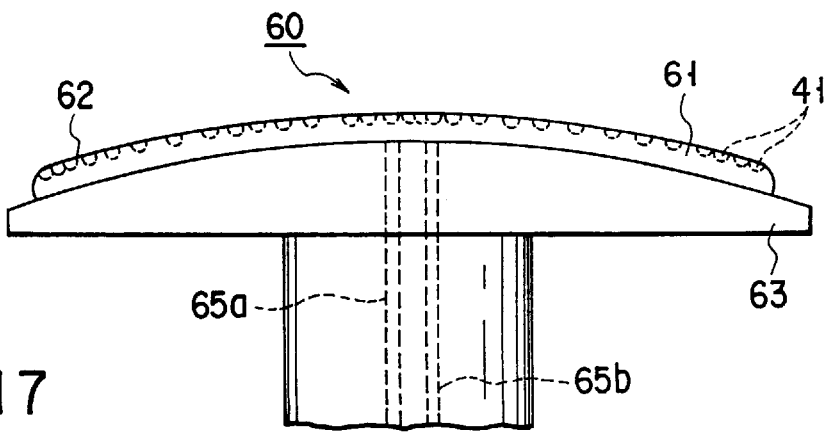
FIG. 17 is a side view of the lower nozzle according to the forth embodiment.

The lower nozzle 60 may have an eight-letter form like a curved tube 62 shown in a plan view of FIG. 16. As shown in FIG. 17, the lower nozzle 60, which is fixed on the support table 63, may have a convex form as viewed from the side. Liquid outlet holes 41 are formed at regular intervals in the nozzle upper portion 61. The lower nozzle 60 of an 8-letter form is advantageous in that the total opening area of the liquid outlet holes 41 is suppressed as small as possible, and the process liquid can be supplied simultaneously to the peripheral portion and the center portion of the lower surface of the wafer W. Furthermore, liquid is not accumulated in the nozzle upper portion 61.

Figure 18:
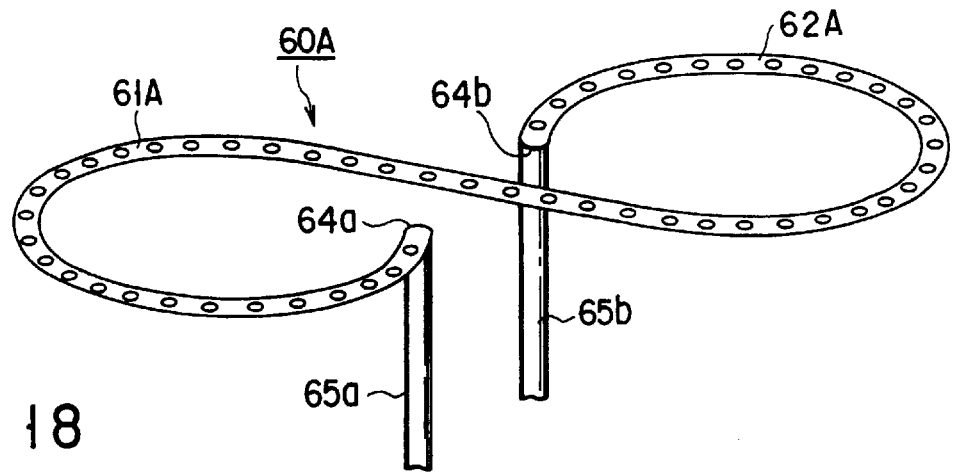
FIG. 18 is a perspective view of the lower nozzle according to a fifth embodiment.

The lower nozzle 60A may be formed in an 8-letter form like a curved pipe 62A in the plan view shown in FIG. 18. The nozzle upper portion 61A is flat. One of ends of the supply port 64a communicates with a first supply pipe 65a. The other end thereof communicates with a second supply pipe 65B. In the lower nozzle 60A, since the process liquid is introduced into the tube 62A through two supply ports 64a, 64b, the process liquid is sprayed more uniformly.

Now, referring to FIGS. 19A and 19B, we will explain how to remove the silicon oxide film coated over the rear surface of the wafer W by using the apparatus according to this embodiment.

As shown in FIG. 19A, the valves 93, 113 are opened to supply the DHF solution to the rear surface (lower surface) of the wafer W from the lower nozzle 30 and to supply pure water to the front surface (upper surface) of the wafer W from the upper nozzle 45. The surface of the wafer W is thus covered with pure wafer, so that the DHF solution supplied to the rear surface of the wafer is prevented from reaching the upper surface of the wafer W. The silicon oxide film 114 is therefore completely removed from the rear surface of the wafer W.

As shown in FIG. 19B, the valve 113 is closed and the open/shut valve 94 is opened to supply pure water to the rear surface of the wafer W from the lower nozzle 30. After the DHF solution is washed away from the wafer W in this way, the open/shut valves 93, 94 are closed and the rotation table 21 is rotated at a high speed to dry up the wafer. As described, the surface of the wafer can be easily protected from the DHF solution only by supplying pure water to the upper surface of the wafer W. Therefore, it is possible to omit a resist coating step and a resist removing step etc., which are performed to prevent the surface of the wafer in the conventional method. Hence, even if the semiconductor device etc., are formed on the surface of the wafer W, it is possible to remove the silicon oxide film 114 coated over the rear surface of the wafer W for a short time. Furthermore, the manufacturing cost can be reduced.

The substrate to be used in the present invention is not limited to a semiconductor wafer. Other types of substrates such as an LCD substrate, a glass substrate, a CD substrate, a photomask, a printing substrate and a ceramic substrate may be applicable in the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for cleaning a substrate, which removes an insulating film from a non-pattern formed surface of the substrate opposite to a pattern formed surface having a pattern formed thereon by photolithography, said apparatus comprising:

a spin chuck for holding the substrate substantially horizontally with the pattern formed surface placed at an upside and the non-pattern formed surface placed at a downside;

a rotation driving mechanism for rotating the spin chuck;

a cup surrounding the substrate held by the spin chuck;

a lower nozzle having a plurality of liquid outlet holes facing both a peripheral portion and a center portion of the non-pattern formed surface of the substrate held by the spin chuck;

a first process liquid supply mechanism for supplying a chemical solution for removing the insulating film from the non-pattern formed surface of the substrate;

an upper nozzle having a plurality of liquid outlet holes facing the pattern formed surface of the substrate held by the spin chuck;

a second process liquid supply mechanism for supplying a rinse solution to the upper nozzle; and a controller for controlling operations of the process liquid supply mechanisms and the rotation driving mechanism, individually, wherein the controller controls the rotation driving mechanism to rotate the spin chuck and controls the first process liquid supply mechanism to supply the chemical solution to the lower nozzle, and simultaneously controls the second process liquid supply mechanism to supply the rinse solution to the upper nozzle, thereby covering the pattern formed surface of the substrate with the rinse solution to protect the pattern formed surface of the substrate from being exposed to the chemical solution applied to the non-pattern formed surface.

2. The apparatus according to claim 1, wherein the rinse solution is pure wafer for protecting the pattern formed surface of the substrate.

3. The apparatus according to claim 1, wherein the chemical solution is an etching solution for dissolving and removing a thin film coated over the non-pattern formed surface of the substrate.

4. The apparatus according to claim 1, wherein the plurality of liquid outlet holes of the lower nozzle are arranged in series so as to face a region extending from a peripheral portion to a center portion of the lower surface of the substrate.

5. The apparatus according to claim 1, wherein the plurality of liquid outlet holes of the lower nozzle are arranged in series so as to face the lower surface of the substrate, extending from a peripheral portion at one side of the substrate to a peripheral portion at the other side through the center portion thereof.

6. The apparatus according to claim 1, wherein the spin chuck has a plurality of holding members for holding the substrate in contact with an outer peripheral edge thereof;

the lower nozzle is a plurality of straight tubes shorter than a length corresponding to a distance from one of the holding members to another holding member; and the liquid outlet holes are formed at an upper portion of the straight tube and arranged along a longitudinal portion of the straight tube.

7. The apparatus according to claim 1, wherein the lower nozzle has a nozzle inner wall having an inlet port communicating with the process liquid supply mechanism, a hindrance board arranged so as to face the inlet port, and a bypass flow passage defined by the hindrance board and the nozzle inner wall, for communicating with the liquid outlet holes.

8. The apparatus according to claim 1, wherein the lower nozzle has a convex form upper portion.

9. The apparatus according to claim 1, wherein the lower nozzle has an 8-letter form when projected to the plan surface.

10. The apparatus according to claim 1, wherein the upper nozzle has a circular shape when projected to the plan surface.

11. The apparatus according to claim 1, the lower nozzle is formed of tube; and the liquid outlet holes are arranged at regular intervals along the longitudinal portion of the tube.

12. The apparatus according to claim 13, wherein inlet ports are formed for supplying the first process liquid into the tube at the both ends of the tube.

13. The apparatus according to claim 1, further comprising a bypass passage for communicating the second process liquid supply mechanism with the lower nozzle.

14. An apparatus for cleaning a substrate, which removes an insulating film from a non-pattern formed surface of the substrate opposite to a pattern formed surface having a pattern formed thereon by photolithography, said apparatus comprising:

a spin chuck for holding the substrate substantially horizontally with the pattern formed surface upward and the non-pattern formed surface downward;

a rotation driving mechanism for rotating the spin chuck;

a cup surrounding the substrate held by the spin chuck;

a lower nozzle having a plurality of liquid outlet holes facing both a peripheral portion and a center portion of the non-pattern formed surface of the substrate held by the spin chuck, said lower nozzle having substantially a cross-letter projection image when projected on a horizontal surface;

a first process liquid supply mechanism for supplying a chemical solution for removing the insulating film from the non-pattern formed surface of the substrate;

an upper nozzle having a plurality of liquid outlet holes facing the pattern formed surface of the substrate held by the spin chuck;

a second process liquid supply mechanism for supplying a rinse solution to the upper nozzle;

a controller for controlling operations of the process liquid supply mechanism and the rotation driving mechanism, individually; and a supporting disk for supporting the lower nozzle in close proximity to the non-pattern formed portion, wherein the controller controls the rotation driving mechanism to rotate the spin chuck and controls the process liquid supply mechanism to supply the chemical solution to the lower nozzle, and simultaneously controls the second process liquid supply mechanism to supply the rinse solution to the upper nozzle, thereby covering the pattern formed surface of the substrate with the rinse solution to protect the pattern formed surface of the substrate from being exposed to the chemical solution applied to the non-pattern formed surface.

* * * * *